US 6,686,641 B2

(12) United States Patent
Honda et al.

(10) Patent No.: US 6,686,641 B2
(45) Date of Patent: Feb. 3, 2004

(54) SEMICONDUCTOR DEVICE AND METHOD FOR DRIVING THE SAME

(75) Inventors: Hirotsugu Honda, Kyoto (JP); Hiroyuki Doi, Kyoto (JP); Katsujirou Arai, Kyoto (JP); Takuo Akashi, Toyama (JP); Naritsugu Yoshii, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 31 days.

(21) Appl. No.: 10/079,510

(22) Filed: Feb. 22, 2002

(65) Prior Publication Data

US 2002/0098615 A1 Jul. 25, 2002

Related U.S. Application Data

(62) Division of application No. 09/239,994, filed on Jan. 29, 1999.

(30) Foreign Application Priority Data

Apr. 17, 1998 (JP) ............................................ 10-107421

(51) Int. Cl.[7] ............................................ H01L 29/861
(52) U.S. Cl. ...................................... 257/481; 257/355
(58) Field of Search ................................ 257/355, 603, 257/481, 483, 487, 606; 361/111, 112

(56) References Cited

U.S. PATENT DOCUMENTS 5,475,245 A * 12/1995 Kudo et al. .................. 257/288
5,691,558 A    11/1997 Davies

FOREIGN PATENT DOCUMENTS

| EP | 0 091 256  | 10/1983 |
| EP | 0 204 336  | 12/1986 |
| JP | 3-014231   | 1/1991  |
| JP | 03-014231  | 1/1991  |
| JP | 4-162681   | 6/1992  |
| JP | 04-162681  | 6/1992  |
| JP | 4-145673   | 8/1992  |
| JP | 04-145673  | 9/1992  |
| JP | 04-162580  | 9/1992  |
| JP | 4-162580   | 9/1992  |
| JP | 7-221115   | 8/1995  |
| JP | 07-221115  | 8/1995  |
| JP | 08-288459  | 11/1996 |
| JP | 8-288459   | 11/1996 |
| JP | 09-289284  | 11/1997 |
| JP | 9-289284   | 11/1997 |

OTHER PUBLICATIONS

European Search Report dated Jul. 7, 1999.
European Search Report May 19, 1999.

(List continued on next page.)

Primary Examiner—Douglas A. Wille
(74) Attorney, Agent, or Firm—Nixon Peabody LLP; Donald R. Studebaker

(57) ABSTRACT

A field oxide surrounding an active region, an N-type doped layer formed in the active region, and an electrode formed on the field oxide in the vicinity of the active region are provided on a P-type semiconductor substrate. During the operation as a constant voltage device, a desired voltage is applied to the electrode. Then, trapping of carriers in the interface between the field oxide and the semiconductor region can be suppressed, although such trapping is ordinarily caused by a reverse breakdown phenomenon at the pn junction between the doped layer and the P-type semiconductor substrate. Accordingly, the variation in strength of the electric field between the doped layer and the semiconductor substrate can be suppressed. As a result, it is possible to suppress a variation in reverse withstand voltage, which is usually caused by a reverse breakdown voltage at a pn junction, for a semiconductor device functioning as a constant voltage device.

5 Claims, 9 Drawing Sheets

OTHER PUBLICATIONS

G. Vanstraelen et al., "Generation Lifetime Monitoring on High Resistivity Silicon Using Gated Diodes," Nuclear Instruments & Methods in Physics Research, vol. A288, No. 1, Mar. 1, 1990, pp. 48–53.

Ohyu et al., "Feasibility of High–Energy Boron Implantation For p–type Retrograde Well Formation," Nuclear Instruments & Methods in Physics Research, Section—B: Beam Interactions with Materials and Atoms, vol. B37/38, No. 2, Feb. 2, 1989, pp. 749–752.

European Search Report dated Jul. 7, 1999.

European Search Report dated May 19, 1999.

G. Vanstraelen et al., "Generation Lifetime Monitoring on High Resisitivity Silicon Using Gated Diodes," Nuclear Instruments & Methods in Physics Research, vol. A288, No. 1, Mar. 1, 1990, pp. 48–53.

Ohyu et al., "Feasibility of High–Energy Boron Implantation For p–type Retrograde Well Formation," Nuclear Instruments & Methods in Physics Research, Section –B: Beam Interactions with Materials and Atoms, vol. B37/38, No. 2, Feb. 2, 1989, pp. 749–752.

* cited by examiner

SEMICONDUCTOR DEVICE AND METHOD FOR DRIVING THE SAME

BACKGROUND OF THE INVENTION

The present invention generally relates to a semiconductor device used for a semiconductor integrated circuit, and more particularly relates to a constant voltage device used as a semiconductor internal voltage booster, for example.

A constant voltage device called "clamping diode" has heretofore been used to fix a voltage, which has been increased by a semiconductor internal voltage booster, at a desired constant voltage. Such a clamping diode is also termed "zener diode", which is used for obtaining a desired constant voltage by utilizing a reverse breakdown phenomenon at a pn junction between a semiconductor substrate and a doped layer formed on the semiconductor substrate. Hereinafter, an exemplary conventional constant voltage device of this type will be described.

FIG. 10 is a cross-sectional view illustrating an exemplary structure of a conventional semiconductor device functioning as a constant voltage device. As shown in FIG. 10, a field oxide 2 is formed on a P-type semiconductor substrate 1 so as to surround and define an active region 3. A P-type doped layer 4 is formed as a channel stopper just under the field oxide 2, and an N-type doped layer 5 is formed in the active region 3. An interlevel dielectric film 6 is formed over the substrate. And the N-type doped layer 5 is connected to an aluminum interconnect 7 through an opening of the interlevel dielectric film 6.

In this case, the constant voltage device is configured in such a manner that the desired constant voltage thereof is determined by a reverse breakdown voltage of the pn junction between the N-type and P-type doped layers 5 and 4. Specifically, when a reverse voltage, exceeding the constant voltage, is applied to the region between the aluminum interconnect 7 and the P-type semiconductor substrate 1,' reverse current flows between the N-type and P-type doped layers 5 and 4 due to the zener effect or avalanche effect. Based on this principle, even if a high voltage is applied, the voltage between the aluminum interconnect 7 and the P-type semiconductor substrate 1 is substantially fixed at a constant voltage.

The conventional configuration, however, has the following problems.

When the reverse breakdown phenomenon happens at the pn junction between the N-type and P-type doped layers 5 and 4, electron-hole pairs are created. And, as shown in FIG. 11, holes, for example, of the electron-hole pairs are trapped in the vicinity of the interface between the field oxide 2 and the P-type doped layer 4 around the periphery of the active region 3. As a result, the strength of the electric field in the direction originating from the N-type doped layer 5 toward the P-type doped layer 4 in the pn junction plane is weakened by the electric field exerted by the holes trapped. Thus, supposing the potential in the P-type semiconductor substrate 1 is constant, a higher voltage should be applied between the N-type doped layer 5 (or the aluminum interconnect 7) and the substrate 1 to increase the voltage between the P-type and N-type doped layers 4 and 5 up to the reverse breakdown voltage at the pn junction. Hereinafter, such a voltage between the N-type doped layer 5 (or the aluminum interconnect 7) and the substrate 1, required to cause the breakdown of the pn junction, will be referred to as a "reverse withstand voltage" Also, as the quantity of charges flowing from the N-type doped layer 5 into the P-type doped layer 4 increases, the total quantity of holes trapped also increases. Thus, the reverse withstand voltage further increases with the passage of time, i.e., varies as represented by the plot identified with X in FIG. 4. It should be noted that electrons might be possibly trapped in the vicinity of the interface between the field oxide 2 and the P-type doped layer 4 depending on the specific structure of the semiconductor device. In such a case, the reverse withstand voltage continuously decreases with time.

That is to say, the overall performance of the semiconductor device as a constant voltage device deteriorates with time, because the reverse withstand voltage is variable from the desired constant voltage.

SUMMARY OF THE INVENTION

In view of these problems, a prime object of the present invention is providing a semiconductor device as a constant voltage device that can suppress the variation in reverse withstand voltage with time by taking various measures.

A first semiconductor device according to the present invention includes: a semiconductor substrate; a semiconductor region of a first conductivity type formed in the semiconductor substrate; a doped layer of a second conductivity type formed in the semiconductor region; an isolating insulator film formed on the semiconductor substrate so as to surround the doped layer; a first electrode in contact with the doped layer; and a second electrode formed at least on the isolating insulator film and made of a conductor film in the vicinity of the doped layer.

In this structure, the quantity of carriers trapped in the interface between the isolating insulator film and the semiconductor region can be reduced by regulating the voltage applied to the second electrode. Accordingly, a semiconductor device having a function of suppressing the variation in reverse withstand voltage can be obtained.

In one embodiment of the present invention, the second electrode is preferably formed on part of the isolating insulator film, the part including at least an end of the isolating insulator film.

In another embodiment of the present invention, the isolating insulator film may be at least partially spaced apart from the doped layer with an offset region interposed therebetween, and the second electrode may overlap the isolating insulator film and the offset region.

In such an embodiment, at least part of the interface between the isolating insulator film and the semiconductor region is offset from the pn junction where electron-hole pairs are created. Accordingly, the quantity of holes or electrons trapped in the vicinity of the interface can be reduced. As a result, a semiconductor device having a superior function of suppressing the variation in reverse withstand voltage can be obtained.

In still another embodiment of the present invention, the second electrode may be connected to a ground terminal.

In an alternate embodiment, the second electrode may be connected to a power supply terminal.

In another alternate embodiment, the second electrode may be connected to the power supply terminal via a resistor.

In still another alternate embodiment, the second electrode may be connected to the doped layer.

In these embodiments, it is possible to suppress carrier trapping using a simple configuration without providing any special control function.

In still another embodiment, the semiconductor device may further include a channel stopper region formed under the isolating insulator film in the semiconductor region and heavily doped with a dopant of the first conductivity type.

In such an embodiment, a semiconductor device exhibiting smaller variation in reverse withstand voltage with time can be formed by regulating the reverse withstand voltage using the channel stopper enhancing the isolation function.

In still another embodiment, the semiconductor device may further include a reverse withstand voltage regulating region formed between the doped layer and the channel stopper region in the semiconductor region and doped with a dopant of the first conductivity type more heavily than the semiconductor region and more lightly than the channel stopper region.

In such an embodiment, the initial value of the reverse withstand voltage can be regulated, and the charge quantity per unit volume of the electron-hole pairs created and trapped can be reduced. Accordingly, it is possible to suppress the variation in reverse withstand voltage with time.

A second semiconductor device according to the present invention includes: a semiconductor substrate; a semiconductor region of a first conductivity type formed in the semiconductor substrate; a doped layer of a second conductivity type formed in the semiconductor region; an isolating insulator film formed on the semiconductor substrate so as to surround the doped layer; and an electrode in contact with the doped layer. The isolating insulator film is at, least partially spaced apart from the doped layer with an offset region interposed therebetween.

In such an embodiment, at least part of the interface between the isolating insulator film and the semiconductor region is offset from the pn junction where electron-hole pairs are created. Accordingly, the quantity of holes or electrons trapped in the vicinity of the interface can be reduced. As a result, a semiconductor device having a superior function of suppressing the variation in reverse withstand voltage can be obtained.

In one embodiment of the present invention, the semiconductor device may further include a channel stopper region formed under the isolating insulator film in the semiconductor region and heavily doped with a dopant of the first conductivity type.

In another embodiment of the present invention, the semiconductor device preferably further includes a reverse withstand voltage regulating region formed between the doped layer and the channel stopper region in the semiconductor region, and doped with a dopant of the first conductivity type more heavily than the semiconductor region and more lightly than the channel stopper region.

A first method according to the present invention is a method for driving a semiconductor device including: a semiconductor substrate; a semiconductor region of a first conductivity type formed in the semiconductor substrate; a doped layer of a second conductivity type formed in the semiconductor region; an isolating insulator film formed on the semiconductor substrate so as to surround the doped layer; a first electrode in contact with the doped layer; and a second electrode formed at least on the isolating insulator film and made of a conductor film in the vicinity of the doped layer. In this method, a potential in the second electrode is controlled such that a reverse withstand voltage between the doped layer and the semiconductor region falls within a predetermined range.

In accordance with this method, it is possible to suppress with certainty a variation in reverse withstand voltage with the passage of time.

A second method according to the present invention is a method for driving a semiconductor device including: a semiconductor substrate; a semiconductor region of a first conductivity type formed in the semiconductor substrate; a doped layer of a second conductivity type formed in the semiconductor region; an isolating insulator film formed on the semiconductor substrate so as to surround the doped layer; a first electrode in contact with the doped layer; and a second electrode formed at least on the isolating insulator film and made of a conductor film in the vicinity of the doped layer. In this method, a voltage for reducing carriers trapped in an interface between the isolating insulator film and the semiconductor region is intermittently applied to the second electrode.

In accordance with this method, even if the reverse withstand voltage of the semiconductor device has varied, the voltage can be refreshed at the initial value thereof.

In one embodiment of the present invention, the device may be operated for a predetermined amount of time with the second electrode held at a first potential selected from the group consisting of: a ground potential; a power supply potential; and a potential of the doped layer. And then the second electrode may be biased at a second potential selected from the group excluding the first potential.

In another embodiment of the present invention, the second electrode may be alternately and repeatedly biased at the first and second potentials.

In still another embodiment, the second electrode may be biased at the first and second potentials cyclically and alternately showing positive and negative values.

In these embodiments, carrier trapping can be suppressed and refreshing for reducing the quantity of carriers trapped can be performed.

DESCRIPTION OF THE PREFERRED EMBODIMENTS

Embodiment 1

Hereinafter, a first embodiment of the semiconductor device according to the present invention will be described with reference to the drawings.

Figure 1:
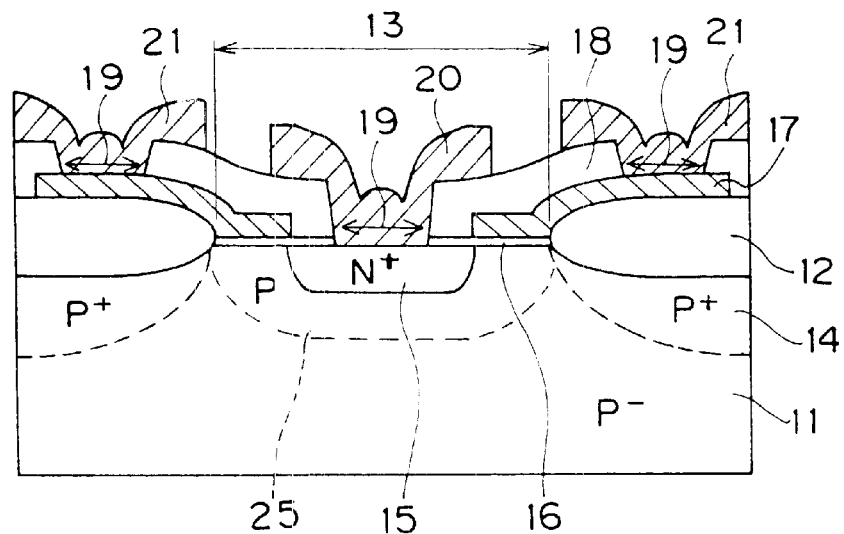
FIG. 1 is a cross-sectional view of a semiconductor device in the first embodiment of the present invention.
Figure 2:
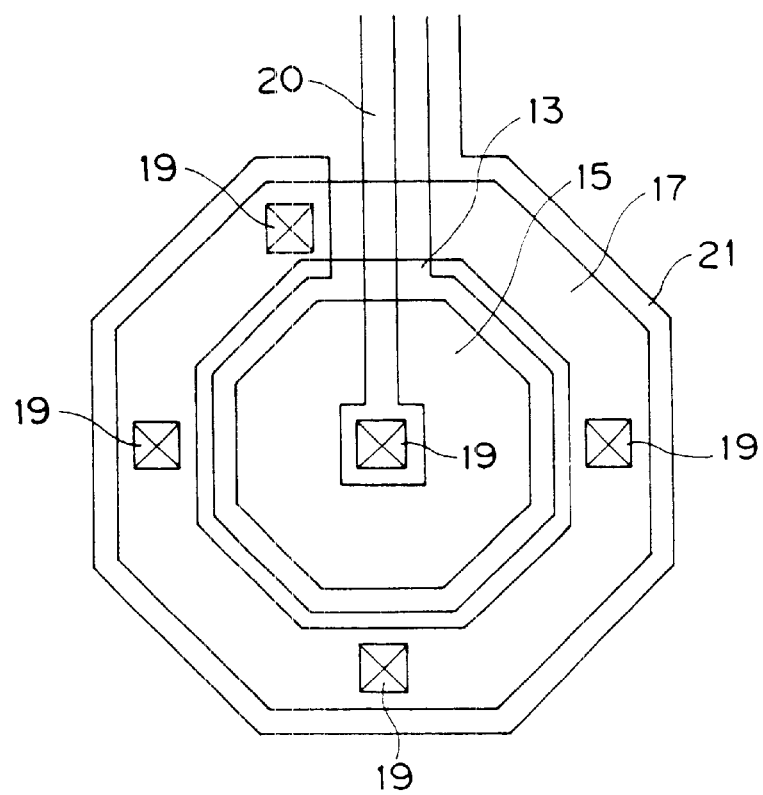
FIG. 2 is a plan view of the semiconductor device in the first embodiment of the present invention.

FIGS. 1 and 2 are respectively cross-sectional view and plan view of the semiconductor device in this embodiment. As shown in FIGS. 1 and 2, the device includes: a P-type semiconductor substrate 11; a field oxide (isolating insulator film) 12; an active region 13; a P-type doped layer 14; an N-type doped layer 15; and a thin oxide film 16 formed over the active region 13. The field oxide 12 is formed by a LOCOS technique on the substrate 11 to surround the active region 13 in the shape of a regular octagon. The P-type doped layer 14 is formed as a channel stopper just under the field oxide 12 by being heavily doped with a P-type dopant. The N-type doped layer 15 is formed in the center portion of the active region 13 by being heavily doped with an N-type dopant. The inner peripheral end of the field oxide 12 is spaced apart from the N-type doped layer 15 with a predetermined gap. An electrode 17 made of polycrystalline silicon in the shape of a regular octagonal ring is provided to overlap the field oxide 12 and the oxide film 16. An interlevel dielectric film 18 is also deposited over the substrate. And first and second aluminum interconnects 20 and 21 are formed on the interlevel dielectric film 18 to make electrical contact with the N-type doped layer 15 and the electrode 17, respectively, though contact holes 19 formed in the interlevel dielectric film 18. The first aluminum interconnect 20 functions as the first electrode, while the electrode 17 functions as the second electrode. A reverse withstand voltage regulating region 25 is also formed to surround the N-type doped layer 15 and make contact with the P-type doped layer 14 in the semiconductor substrate 11 by being doping with a P-type dopant. The dopant concentrations in the N-type doped layer 15, the reverse withstand voltage regulating region 25 and the P-type doped layer 14 are on the orders of $10^{20}/cm^3$, $10^{17}/cm^3$ and $10^8/cm^3$, respectively. The active region 13 is shaped like a regular octagon where a pair of opposed sides are spaced from each other by a distance of about 10 $\mu$m to about 40 $\mu$m. The gap between the inner peripheral end of the field oxide 12 and the N-type doped layer 15 is about 2 $\mu$m. As viewed from above, the outer periphery of the N-type doped layer 15 is substantially aligned with the inner periphery of the electrode 17.

A desired constant voltage required for operating the semiconductor device as a constant voltage device is obtained by one of the following two manners. According to the first possibility, the polysilicon electrode 17 is allowed to be floating, and a positive voltage is continuously applied to the N-type doped layer 15 through the first aluminum interconnect 20 until the voltage between the N-type doped layer 15 and the P-type semiconductor substrate 11 reaches a reverse breakdown voltage at the pn junction. Alternatively, while the electrode 17 is held at a predetermined potential applied through the second aluminum interconnect 21, a positive voltage may be continuously applied to the N-type doped layer 15 through the first aluminum interconnect 20 until the voltage between the N-type doped layer 15 and the P-type semiconductor substrate 11 reaches a reverse breakdown voltage at the pn junction. In this specification, the voltage between the N-type doped layer 15 (or the first aluminum interconnect 20) and the P-type semiconductor substrate 11 is defined as a "reverse withstand voltage".

Hereinafter, the effects to be attained by the semiconductor device of this embodiment will be described.

As described above, carriers of either one type in the electron-hole pairs, created near the pn junction, are likely to be trapped in the vicinity of the boundary between the active region 13 and the field oxide 12 around the interface between the field oxide 12 and the P-type doped layer 14. However, since the semiconductor device of this embodiment is provided with the electrode 17 on the field oxide 12, it is possible to suppress carrier trapping in the interface between the field oxide 12 and the P-type doped layer 14 by regulating the voltage applied to the electrode 17. For example, in a structure where holes are more likely to be trapped, if the electrode 17 is biased at a positive potential, then it is harder for the holes to access the interface, resulting in the suppression of hole trapping. Conversely, in a structure where electrons are more likely to be trapped, electron trapping can be suppressed by biasing the electrode 17 at a negative potential.

In particular, in the semiconductor device of this embodiment, a predetermined gap (e.g., about 2 $\mu$m) is provided between the field oxide 12 and the N-type doped layer 15. In other words, the N-type doped layer 15 is defined to be spaced apart from the P-type doped layer 14 as a channel stopper by about 2 $\mu$m. Accordingly, the pn junction plane is located about 2 $\mu$m away from the boundary between the active region 13 and the field oxide 12. Thus, electrons and holes, which have been generated due to the reverse breakdown phenomenon at the pn junction between the N-type doped layer 15 and the P-type semiconductor substrate 11, are less likely to be trapped in the interface between the field oxide 12 and the P-type doped layer 14 in the vicinity of the boundary between the active region 13 and the field oxide 12. This is why the quantity of electrons and holes trapped per unit time decreases, even if the electrode 17 is floating. As a result, the rate, at which the electric field in the direction originating from the N-type doped layer 15 toward the P-type semiconductor substrate 11 is weakened or strengthened at the pn junction with time, decreases and the variation in reverse withstand voltage is suppressed.

Next, a method for driving the semiconductor device according to this embodiment will be described.

Figure 4:
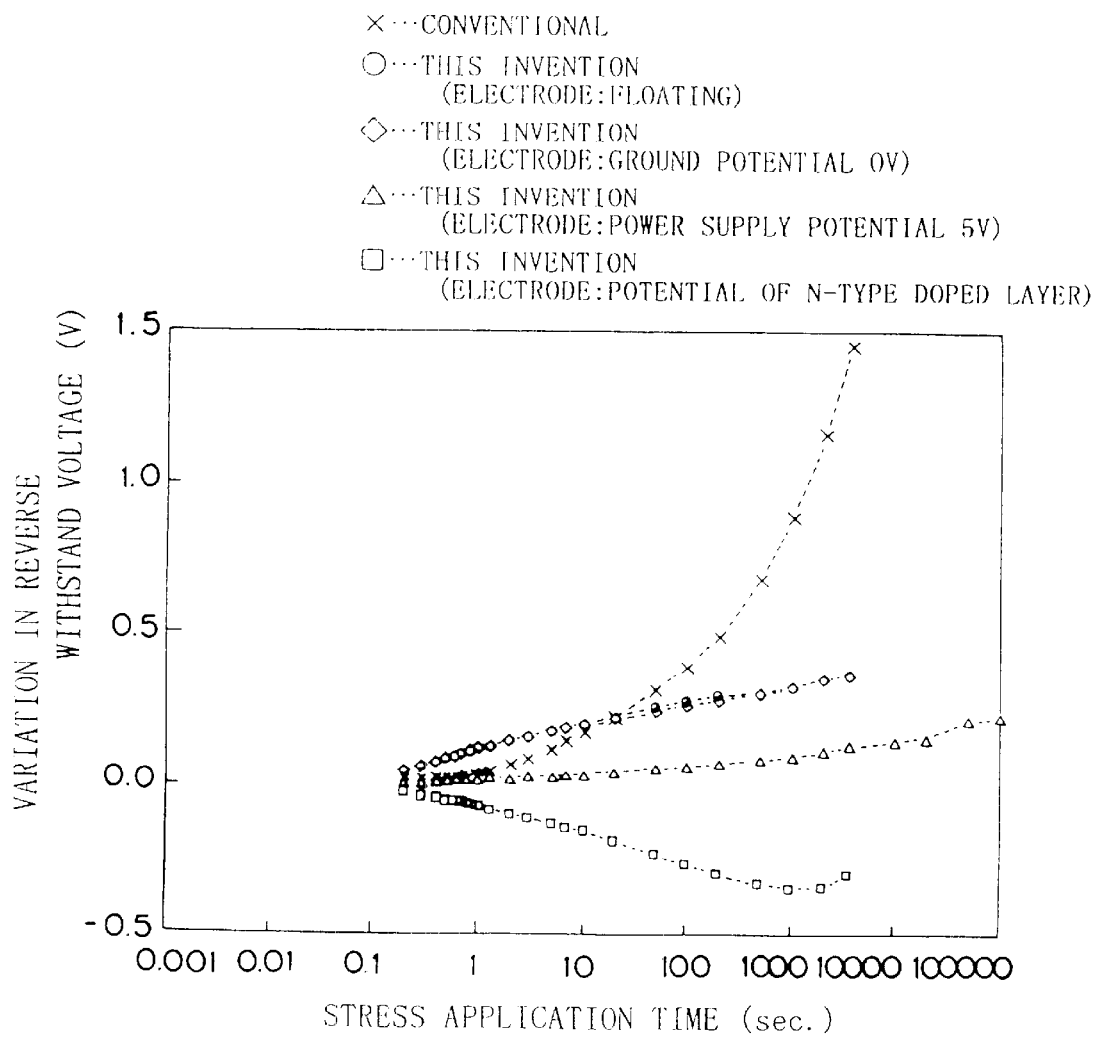
FIG. 4 is a graph illustrating the variation of a reverse withstand voltage with time in the first embodiment of the present invention.

FIG. 4 illustrates variations in reverse withstand voltage with the passage of stress time where mutually different voltages are applied to the electrode 17 in the semiconductor device of the present invention. For the purpose of comparison, data about a conventional semiconductor device is also illustrated in FIG. 4.

As shown in FIG. 4, if the electrode 17 is biased at a power supply potential of 5 V, for example, then the variation in reverse withstand voltage with time can be suppressed at about 0.3 V even after stress has been applied for 1,000 seconds.

Similarly, even if the electrode 17 is biased at a ground potential of 0 V, the variation in reverse withstand voltage can be suppressed within about +0.3 V in the same way as allowing the electrode 17 to be floating.

On the other hand, if the electrode 17 is biased at a potential equal to that of the N-type doped layer 15, the variation in reverse withstand voltage can be suppressed within about −0.35 V, although the reverse withstand voltage decreases in this case.

In this embodiment, the electrode 17 surrounds the active region 13. However, the electrode 17 does not have to entirely surround the active region 13. Even in a structure where the three sides (about three-fourths), two sides (about one half) or one side (about one-fourth) of the active region 13 are surrounded by the electrode 17, the rate of increase/decrease in field strength decelerates because of the above-described mechanism in the portions encircled by the electrode 17. Accordingly, the variation in reverse withstand voltage with time can be suppressed, too.

Hereinafter, it will be described how the type of a bias applied to the electrode should be correlated with the specific structure of the semiconductor device in order to attain the effects of the present invention most efficiently. The correlation is variable, because the majority carriers trapped in the interface between the field oxide 12 and the P-type doped layer 14 are sometimes holes and sometimes electrons depending on the type of the semiconductor device.

First, assume holes, trapped in the interface between the field oxide 12 and the P-type doped layer 14 dominate the variation in reverse withstand voltage with time. In such a case, a potential, inducing a depletion layer and electrons as minority carriers on the surface of the P-type semiconductor substrate 11 and the P-type doped layer 14, should be applied through the second aluminum interconnect 21 to the electrode 17. And the electrode 17 should be held at such a potential. Then, the quantity of holes trapped per unit time owing to the reverse breakdown phenomenon at the pn junction between the N-type doped layer 15 and the P-type semiconductor substrate 11 can be reduced effectively. As a result, the electric field in the direction originating from the N-type doped layer 15 toward the P-type semiconductor substrate 11 is weakened at a lower rate in the pn junction, even if the stress is continuously applied for a longer and longer time. Consequently, the variation in reverse withstand voltage with time can be suppressed.

Next, assume electrons, trapped in the interface between the field oxide 12 and the P-type doped layer 14, dominate the variation in reverse withstand voltage with time. In such a case, a potential, inducing holes as majority carriers on the surface of the P-type semiconductor substrate 11 and the P-type doped layer 14, should be applied through the second aluminum interconnect 21 to the electrode 17, which should be held at such a potential. Then, the quantity of electrons trapped per unit time owing to the reverse breakdown phenomenon at the pn junction between the N-type doped layer 15 and the P-type semiconductor substrate 11 can be reduced effectively. As a result, the electric field in the direction originating from the N-type doped layer 15 toward the P-type semiconductor substrate 11 is strengthened at a lower rate in the pn junction, even if the stress is continuously applied for a longer and longer time. Consequently, the variation in reverse withstand voltage with time can be suppressed.

And the potential applied through the second aluminum interconnect 21 to the electrode 17, i.e., the potential inducing only one of depletion layer, minority carriers and majority carriers on the surface of the P-type semiconductor substrate 11 and the P-type doped layer 14, also varies with time or with the transition of states because of carrier trapping in the interface between the field oxide 12 and the P-type doped layer 14. That is to say, a plurality of modes, where depletion layer, minority carriers and majority carriers are respectively induced on the surface of the P-type semiconductor substrate 11 and the P-type doped layer 14, sometimes coexist in a single semiconductor device. Accordingly, by changing the potential applied to the electrode 17 in accordance with the transition of the modes, the variation in reverse withstand voltage shown in FIG. 4 can be suppressed with the range of ±0.5 V irrespective of the type of the semiconductor device.

However, in actuality, the function of finely regulating the potential of the electrode 17 is not always easily implementable, because such a control requires an overly complicated configuration. In contrast, the function of regulating the potential of the electrode 17 at a ground potential, a power supply potential or the potential of the N-type doped layer 15 is easily implementable, because only electrical connections at respective parts should be controlled to do so. Accordingly, even if various modes, inducing depletion layer, minority carriers and majority carriers on the surface of the P-type semiconductor substrate 11 and the P-type doped layer 14, coexist in a single semiconductor device, the variation in reverse withstand voltage with time has only to be ultimately suppressed. For example, in this embodiment, at a time a positive potential has been applied to the N-type doped layer 15 for 1,000 seconds, the variation in voltage applied to the N-type doped layer 15 with time can be suppressed at about 0.3, 0.1 and −0.35 V, where the electrode 17 is biased at ground potential, power supply potential and potential of the N-type doped layer 15, respectively, as shown in FIG. 4. It should be noted that the electrode 17 can be easily biased at an arbitrary constant voltage between the ground and power supply potentials by interposing a resistor between a power supply terminal and the electrode 17.

Next, a refresh function additionally provided for eliminating carriers once trapped in the interface between the field oxide 12 and the P-type doped layer 14 will be described.

For example, assume the majority carriers trapped in the interface between the field oxide 12 and the P-type doped layer 14 are holes. In such a case, the semiconductor device is operated as a clamping diode for a certain period of time by biasing the electrode 17 at the power supply potential, for example, through the aluminum interconnect 21. And then the electrode 17 is biased at a potential equal to that of the N-type doped layer 15, thereby releasing the trapped holes. As a result, the electric field in the direction originating from the N-type doped layer 15 toward the P-type semiconductor substrate 11 in the pn junction, which has once been weakened, can be restored into its initial state. Accordingly, the variation in reverse withstand voltage with time can also be suppressed after all. Even when electrons are trapped in the interface between the field oxide 12 and the P-type doped layer 14, the same refresh principle is applicable for releasing the trapped carriers, although the polarity of the voltage applied to the electrode 17 is opposite in such a case.

Alternatively, holes, trapped in the interface between the field oxide 12 and the P-type doped layer 14, may be released every cycle by alternately and repeatedly applying power supply potential and potential of the N-type doped layer 15 to the electrode 17 through the second aluminum interconnect 21. As a result, the electric field in the direction originating from the N-type doped layer 15 toward the P-type semiconductor substrate 11 in the pn junction, which has once been weakened, can be restored into its initial state on a cycle-by-cycle basis. Accordingly, the variation in reverse withstand voltage with time can also be suppressed after all. If the majority carriers trapped in the interface between the field oxide 12 and the P-type doped layer 14 are electrons, the same refresh principle is applicable for releasing the trapped carriers, although the polarity of the voltage applied to the electrode 17 is opposite in such a case. In short, such a bias as to eliminate carriers trapped should be applied.

Optionally, holes, trapped in the interface between the field oxide 12 and the P-type doped layer 14, may be released every cycle by applying power supply potential and potential of the N-type doped layer 15 through the second aluminum interconnect 21 to the electrode 17 like alternating current. That is to say, the potentials should be applied to show positive and negative values cyclically and alternately. In such a case, there is no need to control DC pulses. As a result, the electric field in the direction originating from the N-type doped layer 15 toward the P-type semiconductor substrate 11 in the pn junction, which has once been weakened, can be restored into its initial state on a cycle-by-cycle basis. Accordingly, the variation in reverse withstand voltage with time can also be suppressed after all. If the majority carriers trapped in the interface between the field oxide 12 and the P-type doped layer 14 are electrons, the same refresh principle is applicable for releasing the trapped carriers, although the polarity of the voltage applied to the electrode 17 is opposite in such a case.

Next, a method for setting the initial value of the reverse withstand voltage with the bias applied to the electrode 17 will be described.

Figure 5:
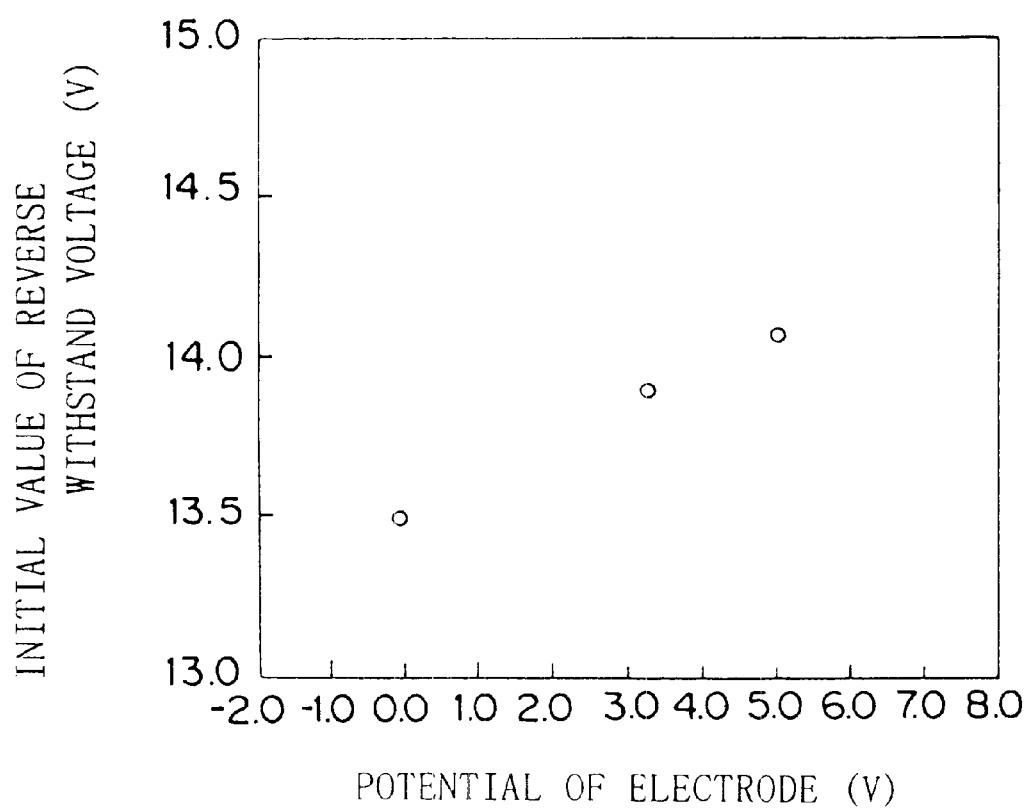
FIG. 5 is a graph illustrating initial values of reverse withstand voltages using the potential of an electrode as a parameter in the first embodiment of the present invention.

FIG. 5 is a graph illustrating the relationship between the potential of the electrode 17 and the initial value of the reverse withstand voltage. As shown in FIG. 5, if the electrode 17 is biased at the ground potential, the initial value of the reverse withstand voltage is about 13.5 V. However, if the electrode 17 is biased at 3.3 V and 5 V, the initial values of the reverse withstand voltage increase to about 13.8 V and about 14.1 V, respectively. The initial value of the reverse withstand voltage is variable in this manner with the bias applied to the electrode 17. The reason is believed to be as follows.

Figure 11:
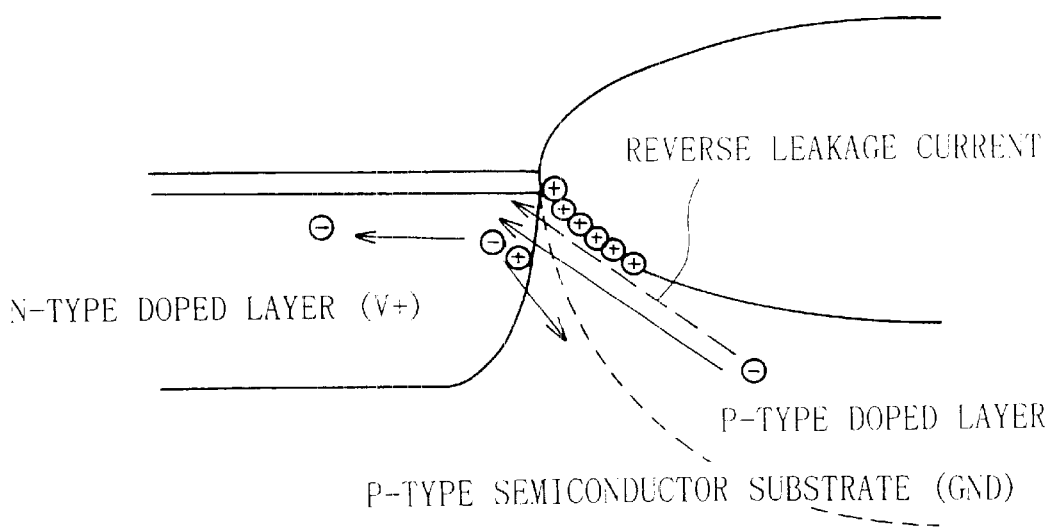
FIG. 11 is a cross-sectional view illustrating how carriers are trapped and how reverse leakage current flows in a constant voltage device.

As indicated by the broken line arrow in FIG. 11 illustrating the structure of a conventional semiconductor device, the path of the reverse leakage current flowing through the pn junction between the N-type doped layer 15 and the P-type semiconductor substrate 11 is located near the end of the opening of the field oxide 12. However, if the electrode 17 is biased at the power supply potential, then a depletion layer expands just under the field oxide 12. As a result, as indicated by the solid line arrow in FIG. 11, the path of the reverse leakage current flowing through the pn junction is located deeper than biasing the electrode 17 at the ground potential. Accordingly, the higher the electrode 17 is biased, the lower the field strength along the path of the leakage current flowing in a reverse biased direction in the pn junction between the N-type doped layer 15 and the P-type semiconductor substrate 11 is. As a result, the initial value of the reverse withstand voltage becomes higher as shown in FIG. 5. As can be understood, the semiconductor device of this embodiment can control the path of the leakage current flowing in a reverse biased direction in the pn junction between the N-type doped layer 15 and the P-type semiconductor substrate 11 with the potential of the electrode 17. As a result, the initial value of the reverse withstand voltage can also be controlled.

The field oxide 12 is herein formed by a LOCOS technique. Alternatively, the field oxide 12 may be replaced with shallow trench isolation (SIT). Also, the electrode 17 may be made of any arbitrary conductor other than polysilicon, e.g., aluminum or a multi-layer structure of polysilicon and silicide. As shown in FIG. 2, a single contact hole 19 is formed over the N-type doped layer 15 and over each of the upper, lower, right and left sides of the electrode 17. Optionally, a plurality of contact holes may be formed at each location.

Hereinafter, respective process steps for fabricating the semiconductor device of this embodiment will be described with reference to FIGS. 3(a) through 3(e).

Figure 3A:
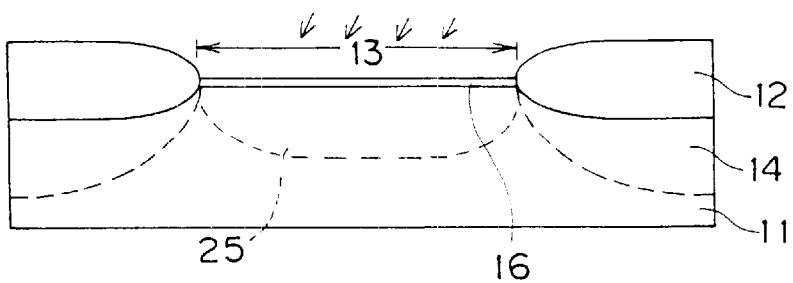
FIGS. 3(a) through 3(e) are cross-sectional views illustrating respective process steps for fabricating the semiconductor device in the first embodiment of the present invention.

First, in the process step shown in FIG. 3(a), the field oxide 12 is formed by a LOCOS technique on the P-type semiconductor substrate 11 so as to surround the regular octagonal active region 13 as shown in FIG. 2. During this process step, an opening is formed in a nitride mask used for formed the LOCOS film. And P-type dopant ions are implanted at a dose on the order of $10^{13}/cm^2$ through the opening into the P-type semiconductor substrate 11, thereby forming the P-type doped layer 14 as a channel stopper to have a dopant concentration on the order of $10^{18}/cm^3$. Next, the oxide film 16 is formed on the active region 13 surrounded by the field oxide 12. Then, P-type dopant ions are implanted at a dose on the order of $10^{12}/cm^2$ using the field oxide 12 as a mask, thereby forming the reverse withstand voltage regulating region 25 in substantially the entire active region 13 to have a dopant concentration on the order of $10^{17}/cm^2$.

Figure 3B:
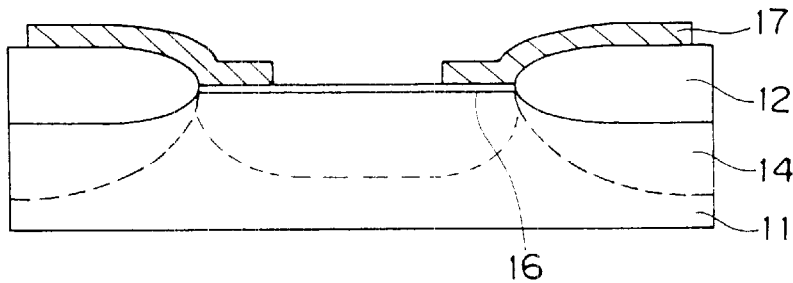

Next, in the process step shown in FIG. 3(b), a polysilicon film is deposited over the entire surface of the substrate and then patterned to form the electrode 17 in the shape of a regular octagonal ring. In this process step, the electrode 17 is formed to overlap the field oxide 12 and the active region 13. And the inner peripheral end of the electrode 17 is located to be about 2 μm inner to the inner peripheral end of the opening of the field oxide 12.

Figure 3C:
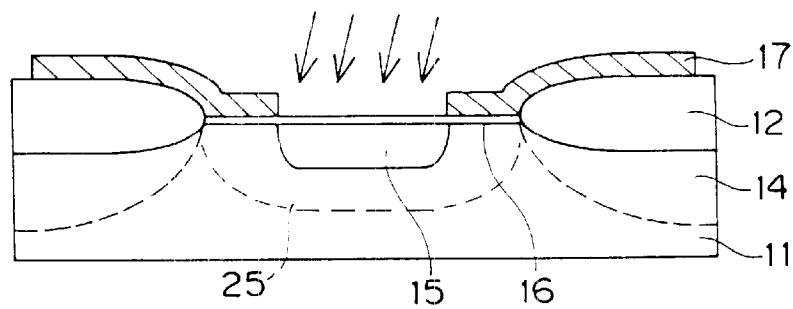

Subsequently, in the process step shown in FIG. 3(c), N-type dopant ions are implanted into the P-type semiconductor substrate 11 at a dose on the order of $10^{15}/cm^2$ using the field oxide 12 and the electrode 17 as a mask, thereby forming the N-type doped layer 15 to have a dopant concentration on the order of $10^{20}/cm^3$. As a result, the N-type doped layer 15 is formed to be offset from the field oxide 12 and the P-type doped layer 14 located under the field oxide 12.

Figure 3D:
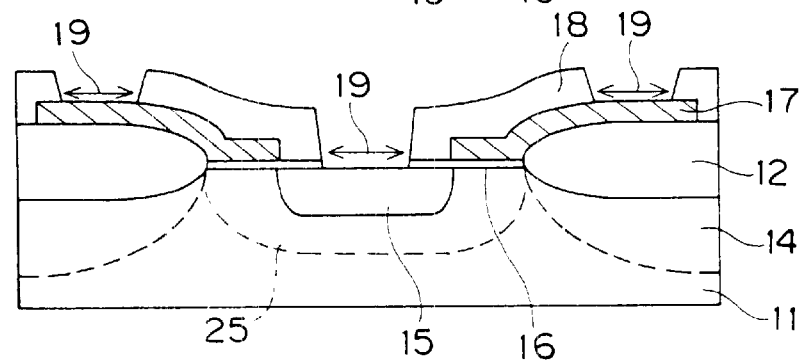

Thereafter, in the process step shown in FIG. 3(d), the interlevel dielectric film 18 is deposited over the entire surface of the substrate and the contact holes 19 reaching the N-type doped layer 15 and the electrode 17, respectively, are formed in the film 18.

Figure 3E:
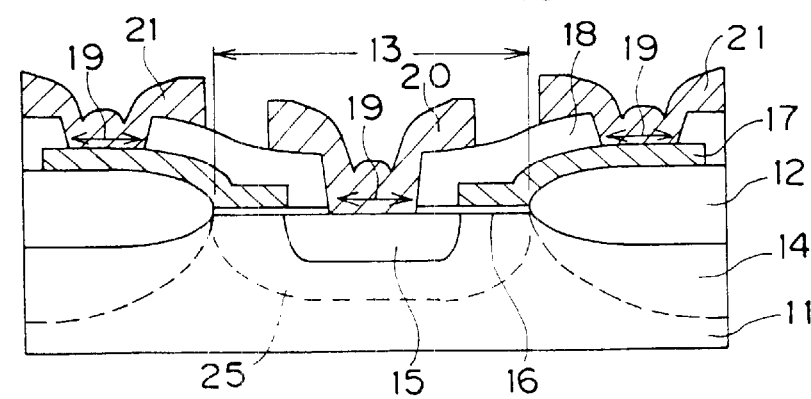

Then, in the process step shown in FIG. 3(e), an aluminum alloy film 19 is deposited over the contact holes 19 and the interlevel dielectric film 18 and patterned, thereby forming the first and second aluminum interconnects 20 and 21 to be connected to the N-type doped layer 15 and the electrode 17, respectively.

As can be understood, the structure of the semiconductor device shown in FIGS. 1 and 2 can be easily formed by performing these process steps.

Embodiment 2

Hereinafter, a second embodiment of the semiconductor device according to the present invention will be described with reference to the drawings.

Figure 6:
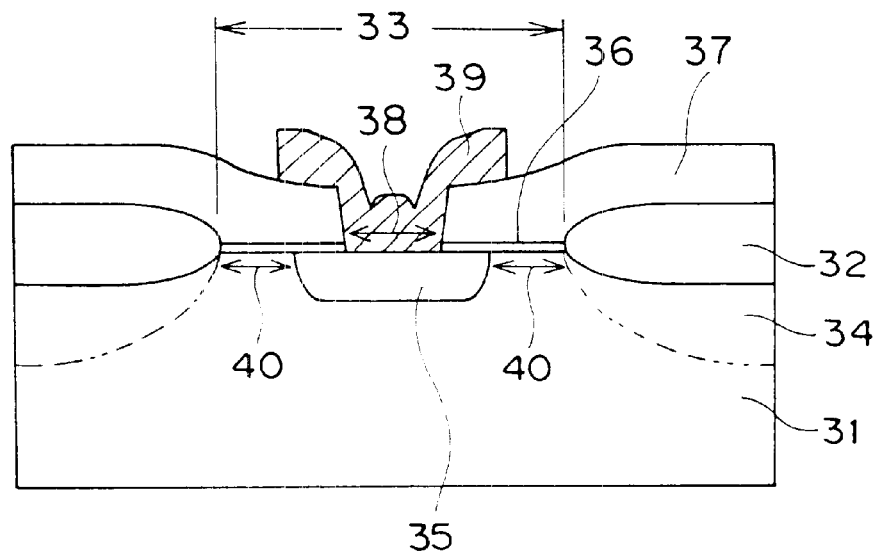
FIG. 6 is a cross-sectional view of a semiconductor device in the second embodiment of the present invention.
Figure 7:
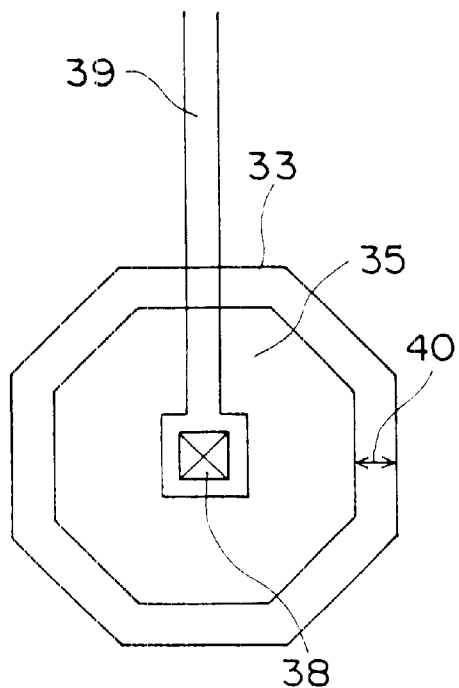
FIG. 7 is a plan view of the semiconductor device in the second embodiment of the present invention.

FIGS. 6 and 7 are respectively cross-sectional view and plan view of the semiconductor device of the second embodiment. As shown in FIGS. 6 and 7, the semiconductor device includes: a P-type semiconductor substrate 31; a field oxide 32; an active region 33; a P-type doped layer 34; an N-type doped layer 35; and a thin oxide film 36 formed over the active region 33. The field oxide 32 is formed by a LOCOS technique on the substrate 31 to surround the active region 33 formed in the shape of regular octagon. The P-type doped layer 34 is formed as a channel stopper just under the field oxide 32 by being heavily doped with a P-type dopant. The N-type doped layer 35 is formed in the center portion of the active region 33 by being heavily doped with an N-type dopant. The inner peripheral end of the field oxide 32 is spaced apart from the N-type doped layer 35 with a predetermined offset region 40 interposed therebetween. An interlevel dielectric film 37 is also deposited over the field oxide 32 and the oxide film 36. And an aluminum interconnect 39 is formed to make electrical contact with the N-type doped layer 35 though a contact hole 38 formed in the interlevel dielectric film 37. The dopant concentrations in the N-type doped layer 35 and the P-type doped layer 34 are on the orders of $10^{20}/cm^3$ and $10^{18}/cm^3$, respectively. The active region 33 is shaped like a regular octagon where a pair of opposed sides are spaced from each other by a distance of about 10 µm to about 40 µm. The gap between the inner peripheral end of the field oxide 32 and the N-type doped layer 35 is about 2 µm.

The semiconductor device of this embodiment does not include any member corresponding to the electrode 17 unlike the first embodiment. However, such a structure can also attain the following effects.

Since the offset region 40 (about 2 µm in width) is provided between the field oxide 32 and the N-type doped layer 35, the N-type doped layer 35 is spaced apart from the P-type doped layer 34 as a channel stopper by the distance of about 2 µm. Accordingly, the pn junction plane is located about 2 µm away from the boundary between the active region 33 and the field oxide 32. Thus, electrons and holes, which have been generated due to the reverse breakdown phenomenon at the pn junction between the N-type doped layer 35 and the P-type semiconductor substrate 31, are less likely to be trapped in the interface between the field oxide 32 and the P-type doped layer 34 in the vicinity of the boundary between the active region 33 and the field oxide 32. This is why the quantity of electrons and holes trapped per unit time decreases. As a result, the rate, at which the electric field in the direction originating from the N-type doped layer 35 toward the P-type semiconductor substrate 31 is weakened or strengthened at the pn junction with time, decreases and the variation in reverse withstand voltage is suppressed.

Accordingly, in the semiconductor device of this embodiment, the reverse withstand voltage varies with time substantially in the same way as the case where the electrode 17 of the first embodiment is floating (as represented by the plot identified with ○ in FIG. 4).

The field oxide 32 is herein formed by a LOCOS technique. Alternatively, the field oxide 32 may be replaced with shallow trench isolation (SIT). As shown in FIG. 6, only a single contact hole 38 is formed over the N-type doped layer 35. Optionally, a plurality of contact holes may be formed instead.

Hereinafter, respective process steps for fabricating the semiconductor device of this embodiment will be described with reference to FIGS. 8(a) through 8(d).

Figure 8A:
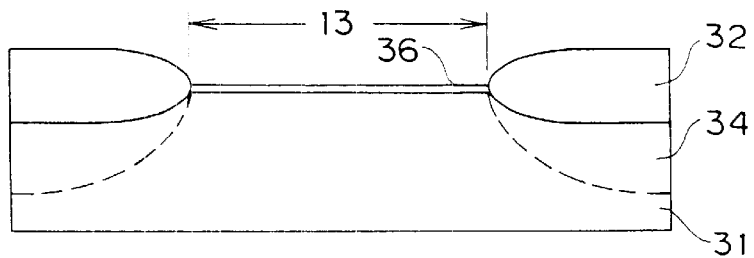
FIGS. 8(a) through 8(d) are cross-sectional views illustrating respective process steps for fabricating the semiconductor device in the second embodiment of the present invention.

First, in the process step shown in FIG. 8(a), the field oxide 32 is formed by a LOCOS technique on the P-type semiconductor substrate 31 so as to surround the regular octagonal active region 33 shown in FIG. 7. During this process step, an opening is formed in a nitride mask used for formed the LOCOS film. And P-type dopant ions are implanted at a dose on the order of $10^{13}/cm^2$ through the opening into the P-type semiconductor substrate 31, thereby forming the P-type doped layer 34 as a channel stopper to have a dopant concentration on the order of $10^{18}/cm^3$. Next, the oxide film 36 is formed on the active region 33 surrounded by the field oxide 32.

Figure 8B:
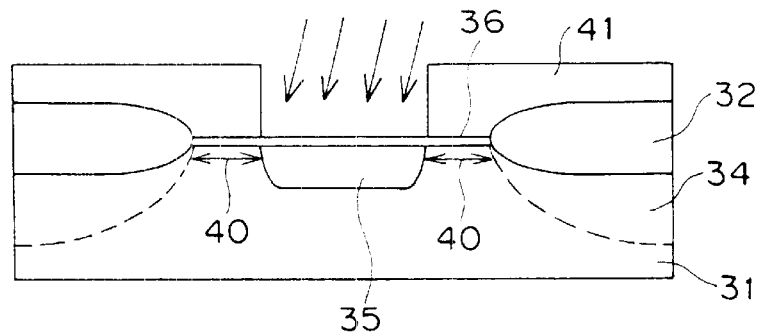

Next, in the process step shown in FIG. 8(b), the surface of the substrate is coated with a photoresist, which is patterned to form a resist film 41 having a regular octagonal opening. In this process step, the resist film 41 is formed to overlap the field oxide 32 and the active region 33. And the inner peripheral end of the opening of the resist film 41 is located to be about 2 µm inner to the inner peripheral end of the field oxide 32. Subsequently, N-type dopant ions are implanted into the P-type semiconductor substrate 31 at a dose on the order of $10^{15}/cm^2$ using the resist film 41 as a mask, thereby forming the N-type doped layer 35 to have a dopant concentration on the order of $10^{20}/cm^3$. As a result, the N-type doped layer 35 is formed to be offset from the field oxide 32 and the P-type doped layer 34 located under the field oxide 32.

Figure 8C:
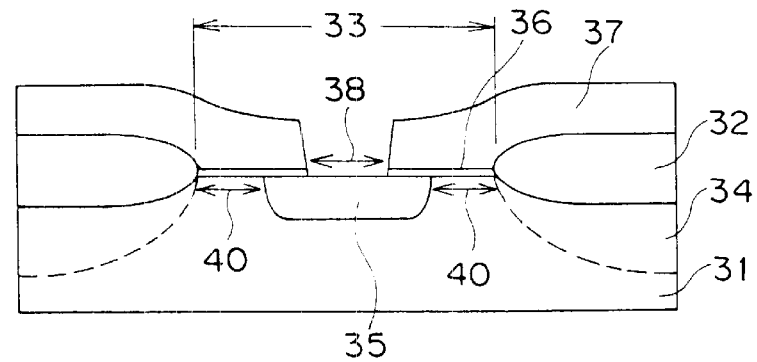

Thereafter, in the process step shown in FIG. 8(c), the interlevel dielectric film 37 is deposited over the entire surface of the substrate and the contact hole 38 reaching the N-type doped layer 35 is formed in the film 37.

Figure 8D:
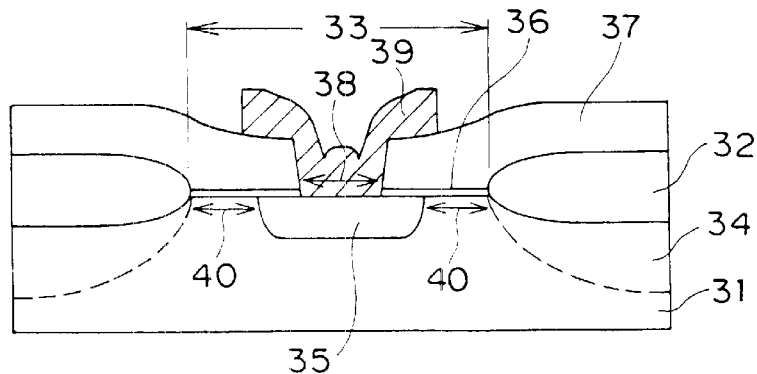

Then, in the process step shown in FIG. 8(d), an aluminum alloy film is deposited over the contact hole 38 and the interlevel dielectric film 37 and patterned, thereby forming the aluminum interconnect 39 to be connected to the N-type doped layer 35.

As can be understood, the structure of the semiconductor device shown in FIGS. 6, and 7 can be easily formed by performing these process steps.

Embodiment 3

Hereinafter, a third embodiment of the semiconductor device according to the present invention will be described with reference to the drawings.

Figure 9:
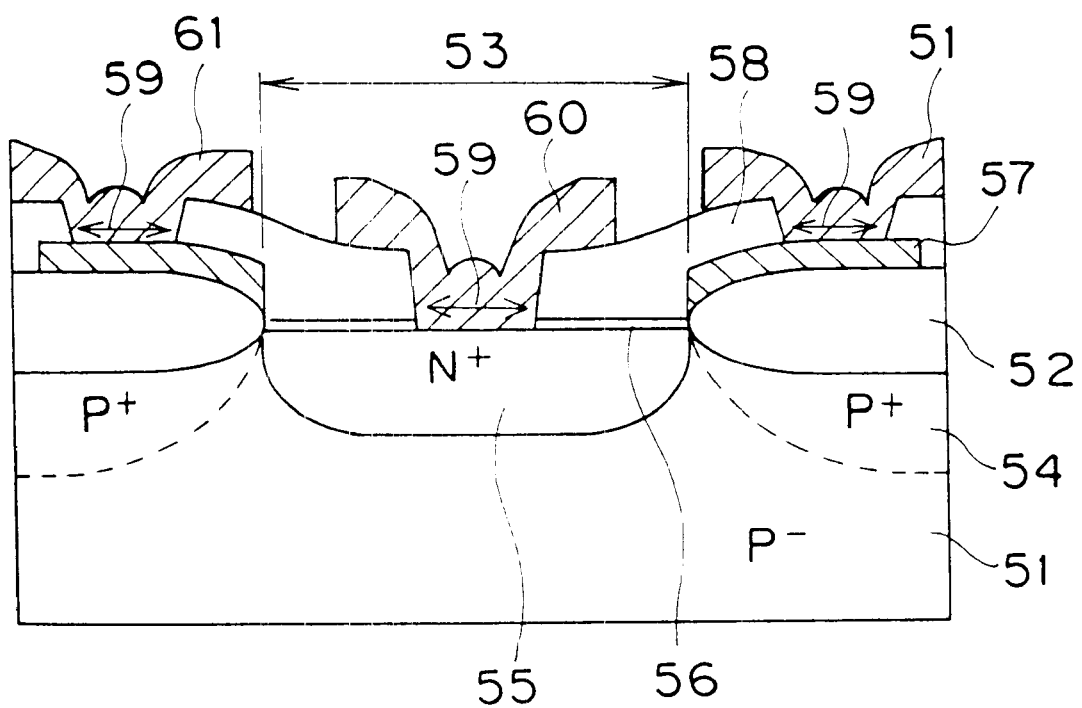
FIG. 9 is a cross-sectional view of a semiconductor device in the third embodiment of the present invention.
Figure 10:
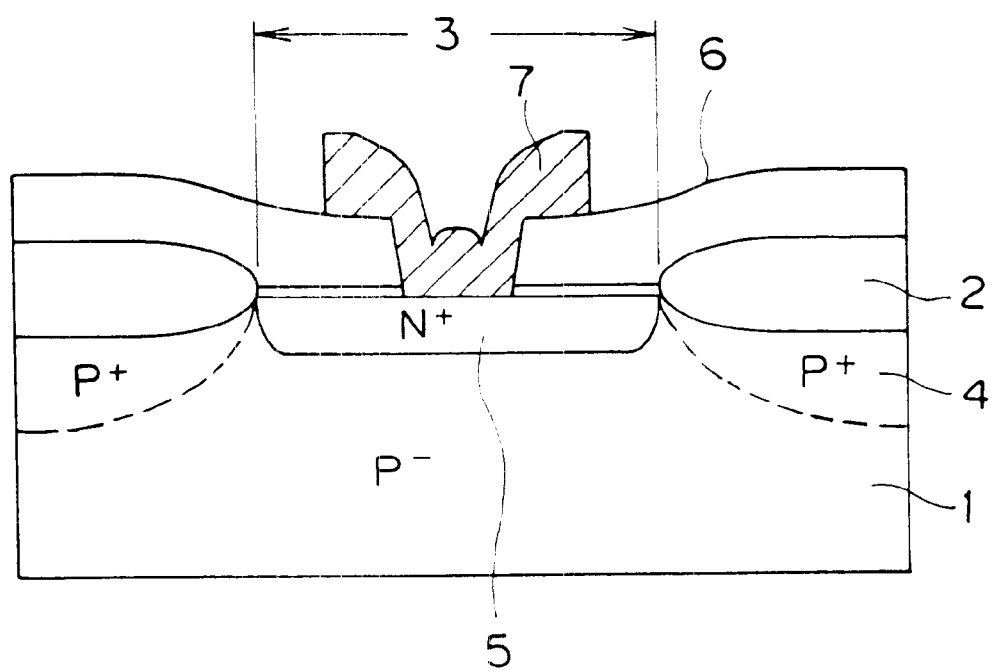
FIG. 10 is a cross-sectional view of a conventional semiconductor device.

FIG. 9 is a cross-sectional view of the semiconductor device in this embodiment. As shown in FIG. 9, the semiconductor device includes: a P-type semiconductor substrate 51; a field oxide 52; an active region 53; a P-type doped layer 54; an N-type doped layer 55; and a thin oxide film 56 formed over the active region 53. The field oxide 52 is formed by a LOCOS technique on the substrate 51 to surround the active region 53 formed in the shape of regular octagon. The P-type doped layer 54 is formed as a channel stopper just under the field oxide 52 by being heavily doped with a P-type dopant. The N-type doped layer 55 is formed in the active region 53 by being heavily doped with an N-type dopant. An electrode 57 made of polycrystalline silicon in the shape of regular octagonal ring is provided over the field oxide 52. An interlevel dielectric film 58 is also deposited over the substrate. And first and second aluminum interconnects 60 and 61 are formed to make electrical contact with the N-type doped layer 55 and the electrode 57, respectively, though contact holes 59 formed in the interlevel dielectric film 58. The dopant concentrations in the N-type doped layer 55 and the P-type doped layer 54 are on the orders of $10^{20}/cm^3$ and $10^{18}/cm^3$, respectively. The active region 53, or the N-type doped layer 55, is shaped like a regular octagon where a pair of opposed sides are spaced from each other by a distance of about 10 µm to about 40 µm.

As described above, carriers of either one type in electron-hole pairs, created near the pn junction, are likely to be trapped in the vicinity of the boundary between the active region 53 and the field oxide 52 around the interface between the field oxide 52 and the P-type doped layer 54. However, since the semiconductor device of this embodiment is provided with the electrode 57 on the field oxide 52, it is possible to suppress carrier trapping in the interface between the field oxide 52 and the P-type doped layer 54 by regulating the voltage applied to the electrode 57. For example, in a structure where holes are more likely to be trapped, if the electrode 57 is biased at a positive potential, then it is harder for the holes to access the interface, resulting in the suppression of hole trapping. Conversely, in a structure where electrons are more likely to be trapped, electron trapping can be suppressed by biasing the electrode 57 at a negative potential.

In this embodiment, as in the first embodiment, the variation in reverse withstand voltage with time can be suppressed within a range of ±0.5 V, for example, by controlling the voltage applied to the electrode 57, i.e., selectively applying a bias voltage equal to the ground potential or the power supply potential to the electrode 57.

Also, even if carriers have once been trapped in the vicinity of the interface between the field oxide 52 and the P-type doped layer 54, a refresh function for eliminating such trapped carriers may be additionally provided.

What is claimed is:

1. A method for driving a semiconductor device, the device comprising: a semiconductor substrate; a semiconductor region of a first conductivity type, which region is formed in the semiconductor substrate; a doped layer of a second conductivity type, which layer is formed in the semiconductor region; an isolating insulator film formed on the semiconductor substrate so as to surround the doped layer; a first electrode in contact with the doped layer; and a second electrode formed at least on the isolating insulator film so that the outer periphery of the doped layer is substantially aligned with the inner periphery of the electrode as viewed from above, and made of a conductor film, wherein a potential in the second electrode is controlled such that a reverse withstand voltage between the doped layer and the semiconductor region falls within a predetermined range.

2. A method for driving a semiconductor device, the device comprising: a semiconductor substrate; a semiconductor region of a first conductivity type, which region is formed in the semiconductor substrate; a doped layer of a second conductivity type, which layer is formed in the semiconductor region; an isolating insulator film formed on the semiconductor substrate so as to surround the doped layer, a first electrode in contact with the doped layer; and a second electrode formed at least on the isolating insulator film so that the outer periphery of the doped layer is substantially aligned with the inner periphery of the electrode as viewed from above, and made of a conductor film, wherein a voltage for reducing the quantity of carriers trapped in an interface between the isolating insulator film and the semiconductor region is intermittently applied to the second electrode.

3. The method of claim 2, wherein the device is operated for a predetermined amount of time with the second electrode held at a first potential selected from the group consisting of: a ground potential; a power supply potential; and a potential of the doped layer, and then the second electrode is biased at a second potential selected from the group excluding the first potential.

4. The method of claim 2, wherein the second electrode is alternately and repeatedly biased at the first and second potentials.

5. The method of claim 2, wherein the second electrode is biased at the first and second potentials showing positive and negative values cyclically and alternately.

* * * * *

UNITED STATES PATENT AND TRADEMARK OFFICE
CERTIFICATE OF CORRECTION

PATENT NO. : 6,686,641 B2
DATED : February 3, 2004
INVENTOR(S) : Hirotsugu Honda et al.

It is certified that error appears in the above-identified patent and that said Letters Patent is hereby corrected as shown below:

Title page,
Item [62], Related U.S. Application Data, delete "09/239,994" and insert
-- 09/239,949 --;
Item [56], References Cited, U.S. PATENT DOCUMENTS, insert
-- 3,798,512  3/1974  Critchlow et al.
   5,322,803  6/1994  Cappelletti et al.
   4,890,187  12/1989  Tailliet et al. --;
FOREIGN PATENT DOCUMENTS, insert
-- JP 55-117279  9/1980
   JP 9-64379 A  3/1997
   JP 01-168064  7/1989
   JP 63-054771 A  3/1988
   JP 03-225875  10/1991 --;
Delete "JP 4-145673  8/1992" insert -- JP 4-245673  9/1992 --; delete "JP 04-145673" insert -- JP 04-245673 --; delete "JP 4-162580" insert -- JP 4-262580 --; delete "JP 04-162580" insert -- JP 04-262580 --;

Column 14,
Line 8, delete "layer," insert -- layer; --;

Signed and Sealed this

Twenty-ninth Day of June, 2004

JON W. DUDAS
*Acting Director of the United States Patent and Trademark Office*